US011955358B2

(12) United States Patent
Vyas et al.

(10) Patent No.: US 11,955,358 B2
(45) Date of Patent: Apr. 9, 2024

(54) MODEL-BASED FAILURE MITIGATION FOR SEMICONDUCTOR PROCESSING SYSTEMS

(71) Applicant: Applied Materials, Inc., Santa Clara, CA (US)

(72) Inventors: Anshul Ashok Vyas, San Ramon, CA (US); Liem Ferryanto, Gilroy, CA (US); Binbin Wang, San Jose, CA (US); Ravi C. Edupuganti, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 209 days.

(21) Appl. No.: 17/484,888

(22) Filed: Sep. 24, 2021

(65) Prior Publication Data

US 2023/0096518 A1 Mar. 30, 2023

(51) Int. Cl.
*C23C 16/52* (2006.01)
*G05B 19/418* (2006.01)
*H01L 21/66* (2006.01)
*H01L 21/67* (2006.01)

(52) U.S. Cl.
CPC ........ *H01L 21/67253* (2013.01); *C23C 16/52* (2013.01); *G05B 19/4184* (2013.01); *H01L 21/67276* (2013.01); *H01L 22/12* (2013.01)

(58) Field of Classification Search
CPC ......... H01L 21/67253; H01L 21/67276; C23C 16/52; G05B 19/4184
See application file for complete search history.

(56) References Cited

U.S. PATENT DOCUMENTS

2020/0226742 A1* 7/2020 Sawlani ............ H01L 21/67288
2020/0234428 A1   7/2020 George et al.

FOREIGN PATENT DOCUMENTS

| CN | 109101749 A    | 12/2018 |
|----|----------------|---------|
| JP | 2008282254 A   | 11/2008 |
| KR | 20200137219 A  | 12/2020 |

OTHER PUBLICATIONS

Application No. PCT/US2022/044427, International Search Report and Written Opinion, dated Jan. 13, 2023, 10 pages.

* cited by examiner

*Primary Examiner* — Manuel A Rivera Vargas
(74) *Attorney, Agent, or Firm* — Kilpatrick Townsend & Stockton LLP

(57) ABSTRACT

A method of detecting failure causes in semiconductor processing systems may include receiving an indication of a failure in a semiconductor processing system and providing the indication of the failure as a query to a network representing the semiconductor processing system. The network may include nodes representing on-wafer effects and component functions, and relationships between the nodes that represent causal dependencies between the component functions and the on-wafer effects. The method may also include calculating a change in probabilities assigned to nodes representing the component functions resulting from the query, and generating an output indicating a probability of at least one of the component functions as a cause of the failure.

20 Claims, 10 Drawing Sheets

MODEL-BASED FAILURE MITIGATION FOR SEMICONDUCTOR PROCESSING SYSTEMS

BACKGROUND

Complex engineering systems may fail in myriad different ways. As engineering systems become more complex, the number of system functions that may have a causal effect on a failure continue to grow. When a failure occurs, it is often difficult to pinpoint a precise function that cause the failure. However, despite this difficulty, an accurate identification of causal risk factors for engineering failures can be monumentally important for preventing such failures from continuously occurring in the future. The current state-of-the-art is to use a linguistic scale basis to rank the risk of each input in a semi-quantitative way. For example, this ranking may be performed by a team of subject matter experts using a numerical scale (e.g., a 1-to-5 scale). Although this methodology uses a numerical ranking system, these ranks are often assigned based on user intuition and personal experience, which leaves these rankings open to cognitive biases. Consequently, human ranking systems resulting in longer times to identify root causes of engineering failures in complex systems.

SUMMARY

In some embodiments, a method of detecting failure causes in semiconductor processing systems may include receiving an indication of a failure in a semiconductor processing system, and providing the indication of the failure as a query to a network representing the semiconductor processing system. The network may include a plurality of nodes representing on-wafer effects and component functions, and a plurality of relationships between the plurality of nodes, where the plurality of relationships may represent causal dependencies between the component functions and the on-wafer effects. The method may also include calculating a change in probabilities assigned to nodes representing the component functions in the plurality of nodes resulting from the query; and generating, based on the change in probabilities, an output indicating a probability of at least one of the component functions as a cause of the failure in the semiconductor processing system.

In some embodiments, a non-transitory computer-readable medium may include instructions that, when executed by one or more processors, may cause the one or more processors to perform operations including receiving an indication of a failure in a semiconductor processing system, and providing the indication of the failure as a query to a network representing the semiconductor processing system. The network may include a plurality of nodes representing on-wafer effects and component functions, and a plurality of relationships between the plurality of nodes, where the plurality of relationships may represent causal dependencies between the component functions and the on-wafer effects. The operations may also include calculating a change in probabilities assigned to nodes representing the component functions in the plurality of nodes resulting from the query; and generating, based on the change in probabilities, an output indicating a probability of at least one of the component functions as a cause of the failure in the semiconductor processing system.

In some embodiments, a system may include one or more processors and one or more memory devices including instructions that, when executed by the one or more processors, cause the one or more processors to perform operations including receiving an indication of a failure in a semiconductor processing system, and providing the indication of the failure as a query to a network representing the semiconductor processing system. The network may include a plurality of nodes representing on-wafer effects and component functions, and a plurality of relationships between the plurality of nodes, where the plurality of relationships may represent causal dependencies between the component functions and the on-wafer effects. The operations may also include calculating a change in probabilities assigned to nodes representing the component functions in the plurality of nodes resulting from the query; and generating, based on the change in probabilities, an output indicating a probability of at least one of the component functions as a cause of the failure in the semiconductor processing system.

In any embodiments, any and all of the following features may be implemented in any combination and without limitation. The network may include a Bayesian network. The component functions may include a gas flow rate, a chamber pressure, and a wafer temperature. The on-wafer effects may include a deposition rate at a plurality of locations on a wafer. The probabilities assigned to the nodes representing the component functions may include probability distributions that are discretized into buckets of numerical ranges. The query may include an event corresponding to a node representing an on-wafer effect, where the event may indicate that the on-wafer effect is outside of a predetermined range. The semiconductor processing system may include a system for depositing a film on a semiconductor wafer. The method/operations may also include accessing a system functional map that may include a data structure that relates requirements for the semiconductor processing system, to functional requirements for components in the semiconductor processing system, to technology components, to on-wafer effects; and automatically generating the network from the functional map. The method/operations may also include receiving operational data for the semiconductor processing system; and calculating initial probabilities for the plurality of nodes in the network based on the operational data for the semiconductor processing system. The operational data may be generated by a simulation of the semiconductor processing system. The operational data may represent sensor measurements from operation of the semiconductor processing system when a failure occurred. The operational data may include values in a numerical range; and the method/operations may also include discretizing the operational data into a plurality of buckets representing sub-ranges within the numerical range. The method/operations may also include using the operational data to statistically verify that the plurality of relationships between the plurality of nodes in the network are correct. Generating the output indicating the probability of the at least one of the component functions as the cause of the failure in the semiconductor processing system may include comparing a prior probability distribution to a posterior probability distribution for a node representing the at least one of the component functions; and generating a divergence metric for the at least one of the component functions. The output indicating the probability of the at least one of the component functions as the cause of the failure may include generating a list of potential causes of the failure ranked by the divergence metric for the at least one of the component functions. Nodes representing on-wafer effects may include a subset of nodes representing one on-wafer effect, where each of the subset of nodes may represent the one on-wafer effect at a different location on a wafer. The system may further include a chemical vapor deposition chamber. The method/operations may also include receiving a change to operational data as a mitigation of the failure in the semiconductor processing system; using the operational data with the change to update the probabilities assigned to nodes representing the component functions; updating probabilities assigned to the nodes representing the on-wafer effects; and determining whether the change to the operational data reduced the probability of the at least one of the component functions as the cause of the failure in the semiconductor processing system based at least in part on the probabilities assigned to the nodes representing the on-wafer effects.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION

Figure 1:
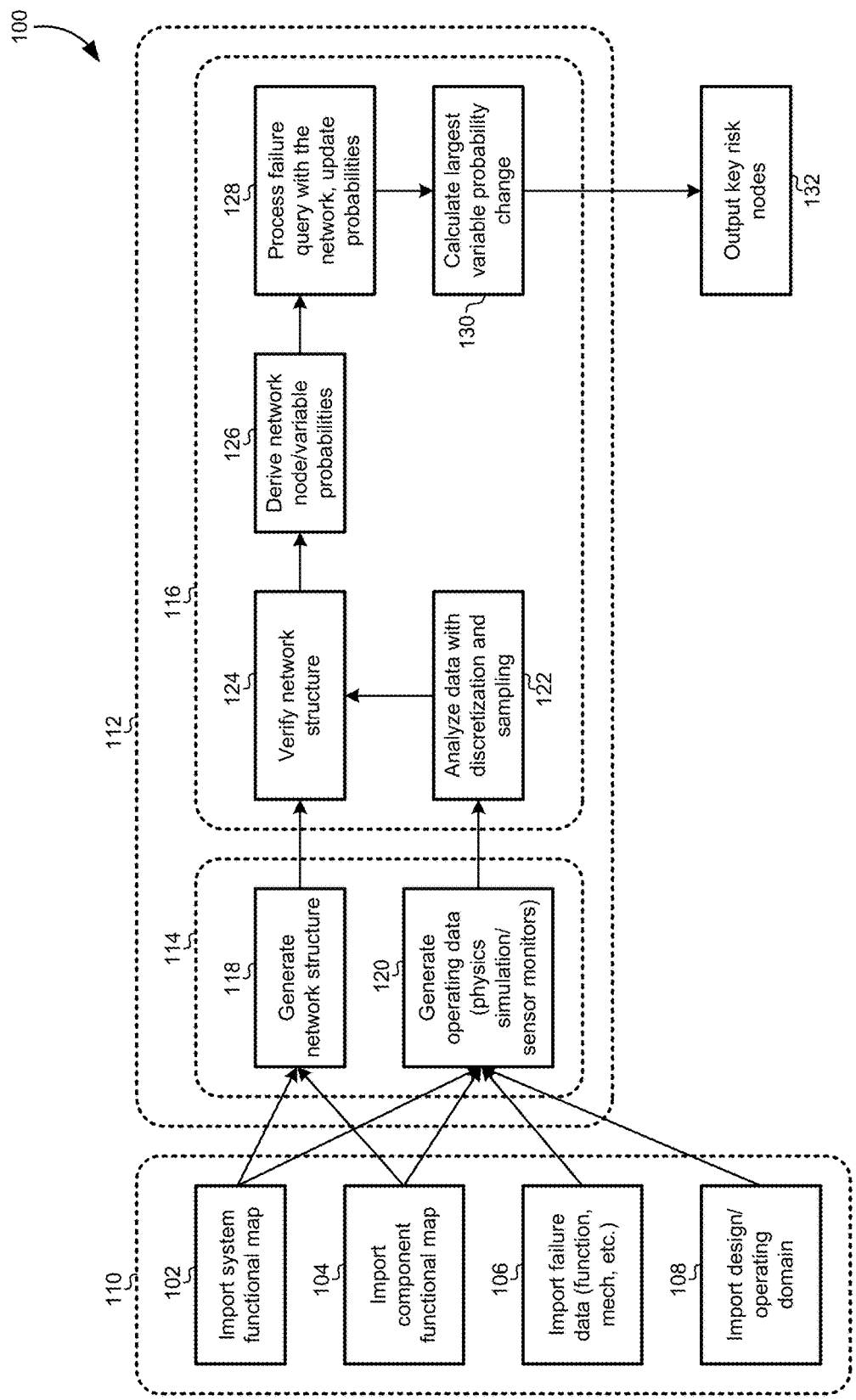
FIG. 1 illustrates a flowchart of a method for identifying failure causes in a semiconductor processing system, according to some embodiments.

Described herein are embodiments for providing an unbiased, physics-based, and probability-driven approach to identifying failures in semiconductor manufacturing systems. This methodology is based primarily on probability mathematics, physics simulations, physical experiments, and quantitative analyses, which removes the cognitive biases that previously plagued systematic failure analysis. This system combines physics-based cause-and-effect relationships to generate a Bayesian network that links functional causes to failure outputs. The Bayesian network can be generated directly from functional mappings, device requirements, and design/technology requirements. The Bayesian network can then be verified using statistical checks, and probabilities for each node in the network can be set using discrete groupings of sensor data and/or simulated data. The Bayesian network may then represent known causal and probabilistic relationships between the operational requirements, technical functions, and design/technology components.

When a new failure occurs, a query representing the failure may be provided to the Bayesian network as a query input. For example, the query may be used to derive updated probabilities at various nodes throughout the network. The marginal prior probabilities can then be compared to the marginal posterior probabilities in the network using a divergence or difference metric to identify functions that are most likely the cause of the failure. The system may then propose a number of different input changes that may be applied to the semiconductor manufacturing system and the network may be iteratively queried and updated until the probability of the failure causes is sufficiently minimized. This provides an objective diagnosis of failures and allows the system to validate proposed mitigation strategies using an objective, data-driven approach. This system may be applied in diagnosing design, system, functional, or safety failures in semiconductor manufacturing systems.

The embodiments described herein may be applied to semiconductor processing and manufacturing equipment. For example, engineering failures may occur in equipment such as chemical vapor deposition chambers, sputtering chambers, etch chambers, plasma chambers, polishing chambers, and/or other equipment used in the semiconductor manufacturing process. These embodiments may also be generally applied to any type of engineered system such as a display processing or manufacturing chamber. Additionally, the embodiments described herein may be applied to a semiconductor processing system as a whole, or alternatively may be applied to individual components in the semiconductor processing system, such as a heater or a flow control valve. For the sake of clarity, this disclosure may use a chemical vapor deposition chamber configured to deposit tungsten bulk film with WF6 and H2 reactants. However, this particular type of semiconductor processing system is provided only by way of example and is not meant to be limiting.

As used herein, the term "failure" may describe any measured system output that falls outside of a predetermined acceptable range. For example, a failure may occur when a thickness of a deposition layer exceeds a maximum allowable thickness. In another example, a failure may occur when a deposition rate of a deposition layer falls above or below a specified range. In another example, a failure may occur when an ash rate in a plasma ashing process falls outside of a specified range. The system described herein may include any of these or other types of failures that may occur in an engineering system as a node in the network described below. When a failure occurs at one of these nodes, the method and system described below may be used to identify a most likely cause of the failure. As used herein, the term "cause" may refer to any condition or input in the engineering system that causes the failure to occur. For example, a cause may include a temperature in a deposition chamber falling outside of a predetermined range. A cause may also refer to a concentration of a chemical reactant being above a predetermined threshold. Causes may be linked to failures through one or more relationships defined in a structural network described below.

FIG. 1 illustrates a flowchart 100 of a method for identifying failure causes in a semiconductor processing system, according to some embodiments. A semiconductor processing system may include an entire semiconductor processing system and/or individual semiconductor processing components that are combined together to form the overall system. As these systems continue to increase in complexity, the relationships between root causes and resulting failures may become obscured and hidden by layers of intermediate functions and results. To solve these and other technical problems, the system performing this method may begin by importing a system functional map (102) and/or importing a component functional map (104). These functional mappings may be maintained in specialized software that tracks these relationships between functions components, and results, and the software may provide data structures that represent these functional mappings to this method.

Figures 2A, 2B:
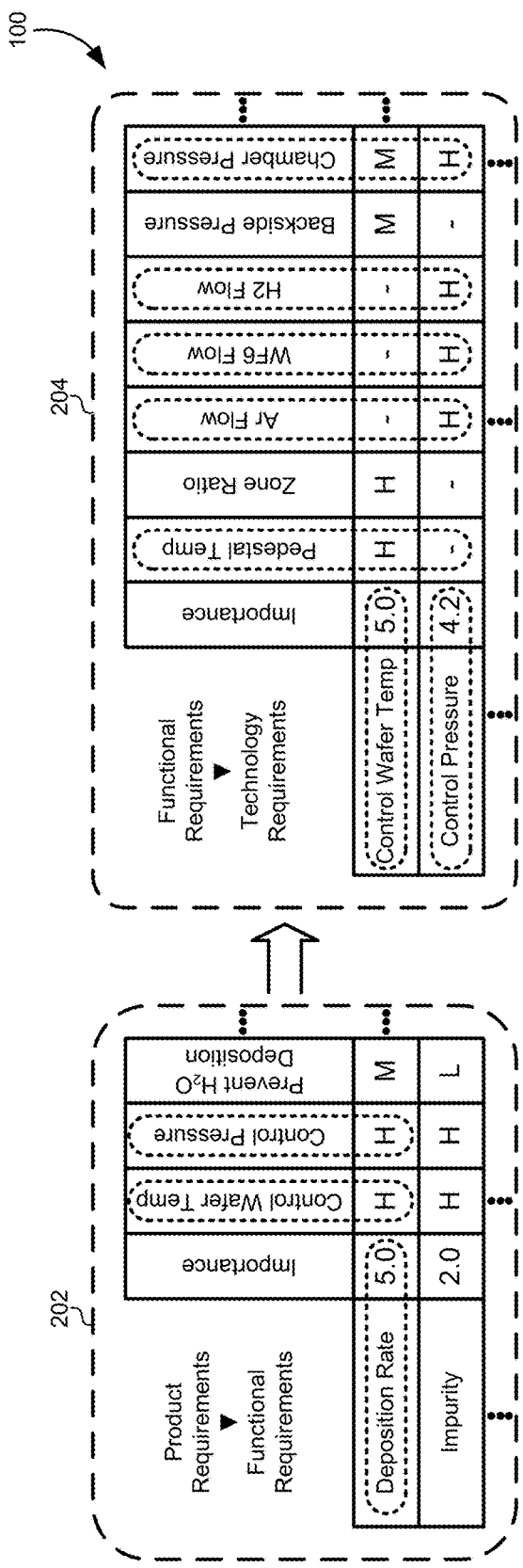
FIG. 2A illustrates a mapping between product requirements and functional requirements, according to some embodiments.
FIG. 2B illustrates how the various mapping data structures may be combined to link possible causes to failure effects, according to some embodiments.

FIG. 2A illustrates a mapping between product requirements and functional requirements, according to some embodiments. The particular example used here may include a thermal chemical vapor deposition (CVD) chamber for depositing tungsten bulk film with WF6 and H2 reactants. Product requirements may also be referred to as customer requirements, and they may represent requirements placed on the system to perform properly. The "product" may be a product of the chamber, such as a semiconductor wafer having a tungsten film deposited thereon. These product requirements may be set by the customer may specify the performance metrics for the chamber or the characteristics of the resulting wafer. Product requirements may include measurable outputs, such as a deposition rate, a film thickness, a resistivity, a layer impurity, a throughput, an ash rate, and/or other results of a semiconductor manufacturing process. Product requirements may be represented at the system level, and component requirements may be represented at the component level.

In this example, a data structure may map product requirements to a set of functional requirements. For example, a data structure 202 maps product requirements, such as a deposition rate, or a resulting impurity, to a set of functional requirements that may be causally related to the product requirements. Based on the product requirements, a set of functional requirements may be selected to be built into the chamber in order to generate the product requirements. In this example, the deposition rate may be related to functional requirements such as controlling a wafer temperature, controlling a partial pressure in the chamber, preventing $H_2O$ bevel deposition, a uniform distribution of chucking, and/or other functional requirements. The mapping may imply that the performance of a functional requirement may impact whether or not a product requirement results in a failure.

The mapping may be generated in a user interface where a subject matter expert can provide relationships in a matrix between the specific product requirements and specific functional requirements as illustrated in FIG. 2A. For example, known relationships between product requirements and functional requirements may be represented in the data structure 202. The user may provide an estimate of the strength of the relationship between the product requirement and the functional requirement. This may be characterized using a numerical requirement (e.g., 5.00) and/or using a qualitative requirement (e.g., high (H), medium (M), and low (L)).

Multiple levels of mappings may be represented by different data structures. For example, some embodiments may also map a functional requirement to a technology requirement. Technology requirements may represent different operations performed by technologies or components in the system. For example, a data structure 204 may map functional requirements to technology requirements. The functional requirements from the vertical column in the data structure 202 may now be represented in the horizontal rows in the data structure 204. For example, the functional requirements of controlling pressure or controlling wafer temperature may be related to technology requirements such as controlling a pedestal temperature, controlling a flow of various gases or other reactants (e.g., Ar, WF6, H2, etc.), controlling a chamber pressure, and/or other requirements that may be placed on different technology components.

Although not represented explicitly in FIG. 2A, some embodiments may include data structures that map additional layers between the product requirements and the specific technology components in the semiconductor manufacturing system. For example, mappings may be represented between product requirements, functional requirements, design goals, and/or technology components that are added to the system. For example, multiple methods may be available to heat the wafer, and depending on the specific heating technology selected, the set of technology requirements may be different for the wafer/temperature functional requirement.

FIG. 2B illustrates how the various mapping data structures may be combined to link possible causes to failure effects, according to some embodiments. In this example, the technology requirements (e.g., pedestal temperature, chamber pressure, reactive flowrates, etc.) may be identified as possible causes 210 of a failure. Using the mappings from the data structures 202, 204 described above, these possible causes 210 may be linked to functional requirements 212, such as controlling a wafer temperature, controlling a partial pressure, and so forth. These functional requirements 212 may then be linked to on-wafer effects 214, such as a deposition rate. By linking together these data structures, individual on-wafer effects 214 can be mapped back to a specific list of possible causes 210 through a hierarchy of relationships when the effect represents a failure.

Some embodiments may present the user interfaces illustrated in FIG. 2A and allow the user to input functional requirements, product requirements, and so forth. The user interfaces may also allow the user to form relationships between entities in the horizontal rows and the vertical columns, such as between functional requirements and product requirements. In some embodiments, the user may also enter a numerical score, while other embodiments may automatically calculate and enter the numerical score using the process described below to characterize the causal relationship between the entities.

Turning back to FIG. 1, importing the system/component functional maps (102, 104) may include importing the data structures described above in FIGS. 2A-2B. The method may then include generating a network structure (118). The network structure may include a plurality of nodes. Each individual node may represent an entry in one of the data structures from FIGS. 2A-2B. The edges between these nodes in the data structure may represent relationships between the nodes. These relationships may be causal relationships between the functions, components, and/or requirements represented by the nodes. For example, a relationship or edge between two nodes in the data structure may indicate a causal relationship between the function in a parent node and a result in a child node.

Figure 3:
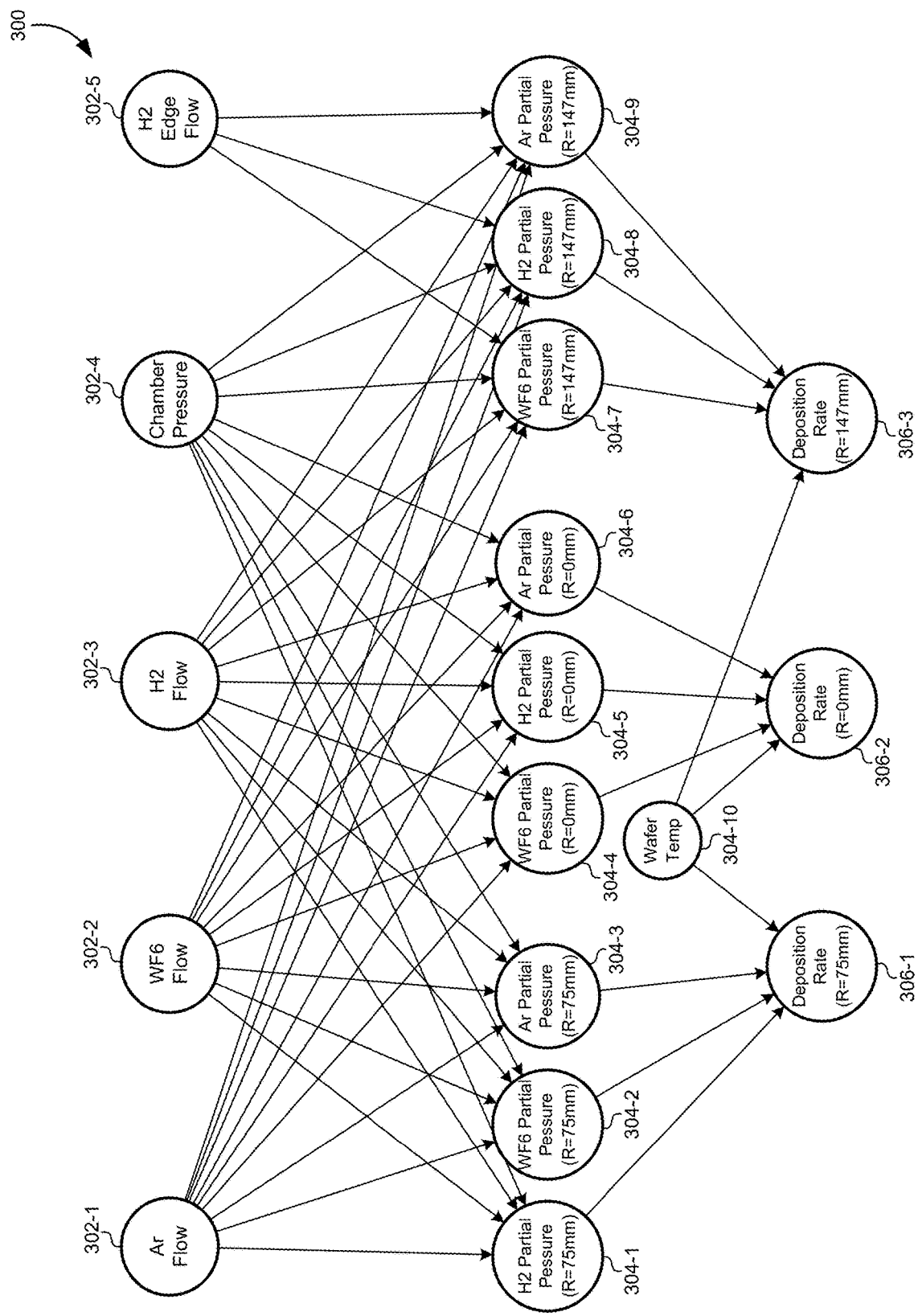
FIG. 3 illustrates a network structure that may be generated based on the functional mappings, according to some embodiments.

FIG. 3 illustrates a network structure 300 that may be generated based on the functional mappings, according to some embodiments. The system may automatically import the data structures described above in FIG. 2A to establish the nodes and relationships illustrated in the network structure 300. Note that some embodiments need not establish relationships between every node represented in a data structure. For example, the strength of the relationship (e.g., the numerical score) may be subjected to a threshold. If the strength of the relationship is not greater than the threshold, the relationship need not be represented in the network structure 300. Other embodiments may represent all relationships. The method may proceed automatically by creating nodes for every function, requirement, component, etc., that has at least one relationship with another function, requirement, component, etc., having a sufficient numerical score or user-assigned qualitative relationship. The method may then generate relationships between the nodes based on the relationships specified in the imported data structures.

In the example of FIG. 3, the rows/columns in the data structures of FIG. 2A may be mapped into layers of nodes in the network structure 300. For example, the nodes 302 in the top-most layer may represent the design or technology requirements. The nodes 304 in the middle layer may represent the functional requirements. Collectively, the nodes 302 (along with any other internal layers not illustrated specifically in FIG. 3) may be referred to as component functions. For example, controlling the flow of hydrogen gas (node 302-3) may be a functional requirement that corresponds to a component function, such as a gas valve that controls gas flow. Similarly, the partial pressure of the hydrogen gas at a specific location on the wafer may also be included as a component function since this relates to a requirement for the gas control components. The nodes 306 and the bottom layer may represent the on-wafer effects that may be measured and represent the product requirements. Therefore, the bottom layer of nodes 306 may be the on-wafer effects, and all nodes from which the on-wafer effects depend may be broadly referred to as component functions. The relationships in the network may represent causal dependencies between the various component functions and the resulting on-wafer effects.

As will be described in greater detail below, some of the sensor measurements and on-wafer effects that are measured for product requirements and other functional requirements may have a range of continuous values. Instead of representing each specific measurement as a separate node, measurements may be discretized and combined into groups of measurement ranges. This results in more efficient and easier processing of the data and efficiently represents nonlinear behavior in the data. Therefore, different functional nodes 304 and on-wafer effects nodes 306 have been generated measurements on different locations on the wafer. Stated differently, each on-wafer effect may generate a subset of nodes representing that effect at different locations on the wafer. For example, a deposition rate may be measured at a radius of 0 mm, 75 mm (e.g., a midpoint), and/or 147 mm (e.g., an outer circumference of the wafer).

In this example, the output node or product requirement represents the deposition rate of the film on the wafer in the chamber during the process. Note that the network structure 300 illustrated in FIG. 3 may represent only one of the product requirements as an output. Other embodiments may generate more complex network structures or additional network structures that represent additional product requirements or output effects. In this example, the deposition rate at the different radii of the wafer may be probabilistically independent from each other since no relationship is directly established between these nodes. However, functional nodes 304 and/or causal nodes 302 may contribute to multiple effects nodes 306. For example, a wafer temperature may have a causal effect on the deposition rate at each location on the wafer as indicated by the relationships between the wafer temperature node and the effect nodes 306. Thus, the chain of physical relationships should match the chain of probabilistic relationships in the network structure 300.

Turning back to FIG. 1, the method may also include generating operating data (120). The operating data may be generated from sensor measurements and/or imported from failure data (106). For example, operational data may be received from sensor measurements from an actual operation of the semiconductor processing system when a failure occurred. The operating data may also be imported from a design/operating domain (108) as using a physics simulation of the semiconductor processing system. Collecting actual data from live operation of a semiconductor processing system may be difficult when developing a failure-analysis system. Therefore, some embodiments may import data from a physics simulation, and the simulation data can then be calibrated using actual data measured from the chamber. This ensures the simulation data matches the actual data that would be produced in the physical chamber.

Virtual sensors may be used to collect data from simulations, or alternatively sensors from a physical chamber may be monitored and sampled to collect physical data. A simulation may provide minimum/maximum ranges for each of the input parameters representing causal nodes in the network structure 300. For example, these ranges may be set for gas flow rates, including Ar flow (e.g., 2500-3500 sccm), WF6 flow (e.g., 350-450 sccm), H2 flow (e.g., 7000-8000 sccm), wafer temperature (e.g., 300-400° C.), and so forth. These ranges may be simulated to generate a comprehensive set output data to characterize the response of the chamber over these operating ranges.

Optionally, some embodiments may analyze and format the data using discrete ranges to reduce the complexity of the data (122). The simulation and/or measured data may include nonlinear data that may be distributed throughout an operating range. In order to make the data easier to work with and minimize the number of probabilities that need to be assigned to nodes in the network structure, the data sets from the simulations may be discretized or grouped into sub-ranges. Using discrete numbers rather than continuous ranges of data makes the computations more efficient and the representation of the data simpler. For example, if the operational data occupies a large numerical range, the system may first discretize the operational data into a plurality of "buckets," each of which may represent numerical values falling in some ranges within the numerical range. Thus, each bucket may function as part of a histogram of values falling within the corresponding sub-range.

Figure 4:
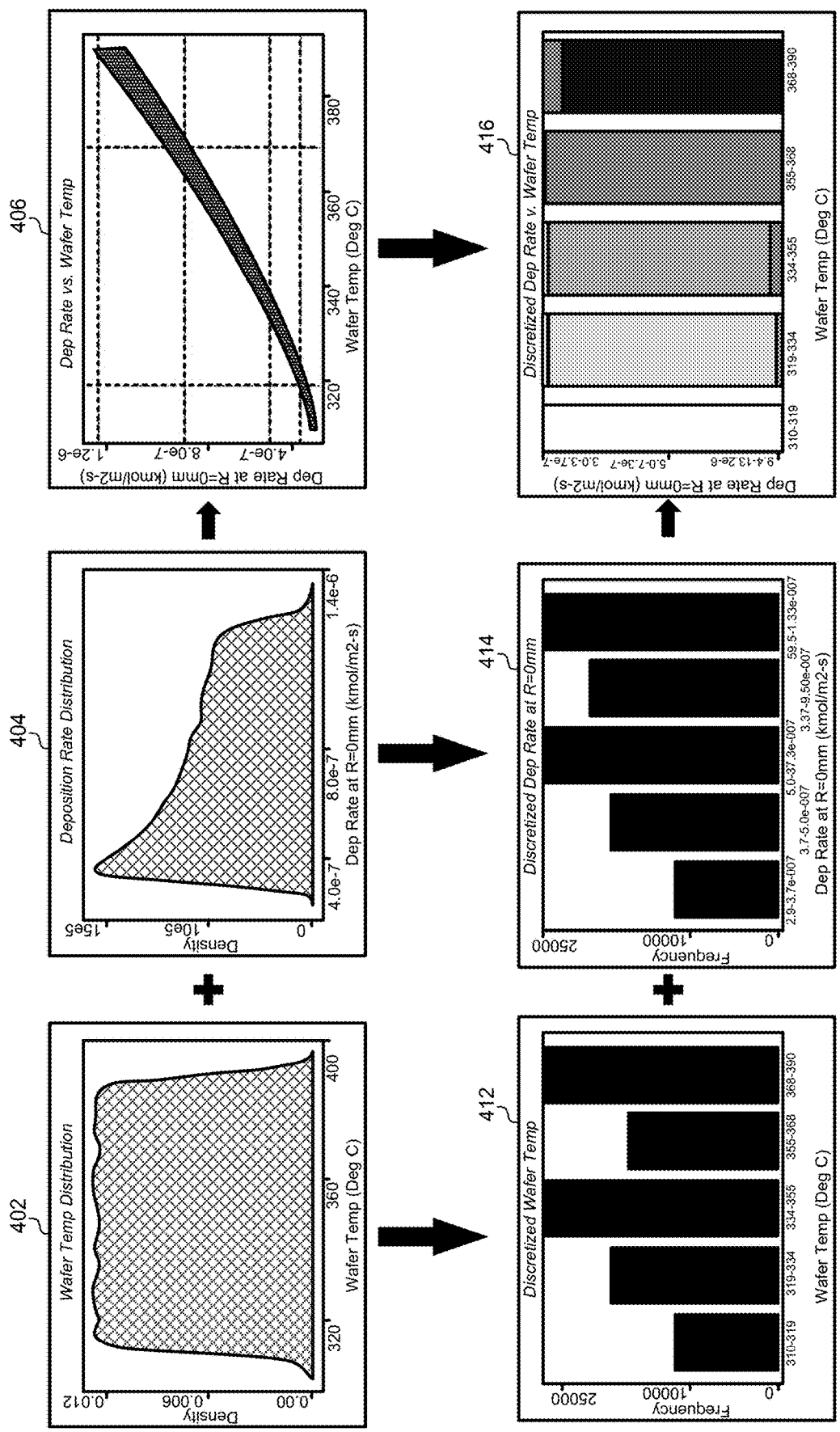
FIG. 4 illustrates how the simulation data can be subdivided into discrete blocks, according to some embodiments.

FIG. 4 illustrates how the simulation data can be subdivided into discrete blocks, according to some embodiments. Graph 402 represents the data point density as a function of wafer temperature. Similarly, graph 402 represents the data point density as a function of the deposition rate at the center of the wafer. Graph 406 represents the wafer temperature as a function of the deposition rate. Note that the ranges here are continuous over a wide spectrum of possible values. This many values would normally require nodes and calculations for each possible value. Therefore, some embodiments may simplify this distribution by creating a smaller number of discrete groups or buckets for the data represented by a single value.

For example, graph 412 represents the data from graph 402 subdivided into five groups or buckets of data. The frequency of data points in each bucket is shown for each of the five discrete ranges of values. Similarly, graph 414 represents the data from graph 404 subdivided into five groups or buckets of data. Again, the frequency of data points in each bucket is shown for each of the five ranges of deposition rates at the center of the wafer. Finally, conditions for each of the effects (e.g., deposition rates) are shown as a function of wafer temperature in the five discrete groupings in graph 416. Focusing on graph 416, the highest wafer temperature results in approximately a 95% chance of generating a failed wafer deposition rate that falls outside of the product requirements.

Turning back to FIG. 1, some embodiments may verify that the network structure is correct (124). Statistical methods may be used to check the accuracy of the network structure. As described above, the network structure may be built based upon identified relationships between functions, causes, effects, and other aspects of the relationships between product requirements and technology implementations. However, one of the technical benefits provided by these embodiments is minimizing the human bias that may be imprinted on the analysis of identifying a cause of failure. Therefore, the network structure may be verified independently using probability-based and simulation-based methods.

Specifically, the domain knowledge and physical relationships used to form the network can be compared to the simulated or measured data collected above. If a strong statistical or probabilistic correlation is demonstrated between a parent node and a child node, then that relationship may be verified in the network structure. However, if the data indicates a very weak correlation between the parent node and the child node, then that relationship can be removed from the network structure. Additionally, nodes that are not related in the network structure but that have a strong causal correlation indicated by the simulated/measured data can have relationships added in the network structure. A number of different statistical methods may be used to discover and/or verify causal relationships between nodes, such as a mutual information $G^2$ test. Continuing with the example of the CVD chamber described above, it may be observed that large temperature variability dominates deposition rate consistent with the Arrhenius reaction rate, thereby further validating the network structure.

Figure 5:
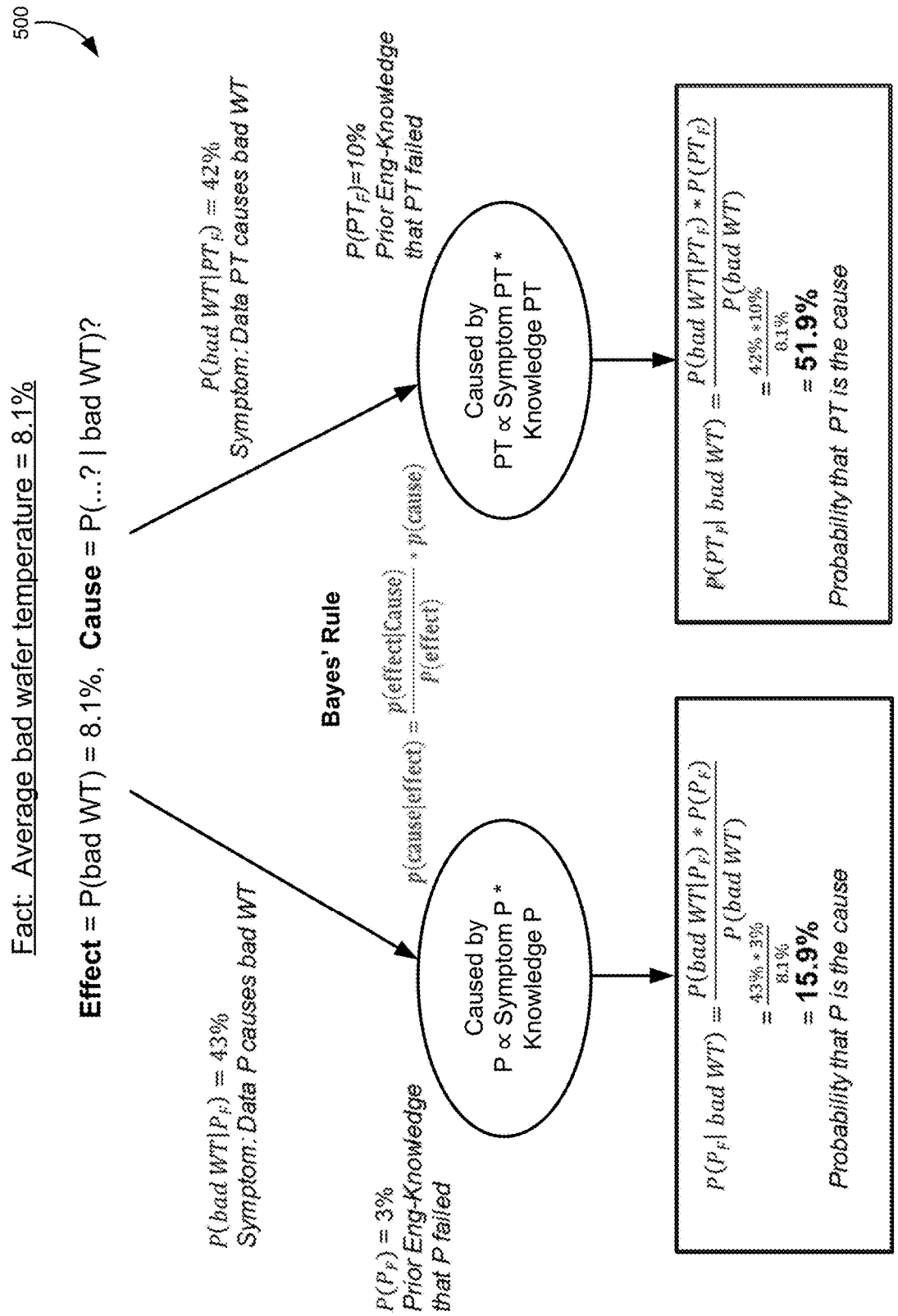
FIG. 5 illustrates one example of how Bayes' Rule may be applied to a chain of relationships, according to some embodiments.

The method may further include deriving initial network node probabilities for each node in the network structure (126). In some embodiments, the network structure may represent a Bayesian network that includes probabilities that are based on Bayes' Rule. FIG. 5 illustrates one example of how Bayes' Rule may be applied to a chain of relationships, according to some embodiments. In this example, the observed on-wafer effect may be a wafer temperature that falls outside of a predetermined acceptable range. This effect may be observed 8.1% of the time (the probability P(bad WT)=8.1%). The Bayesian network may be constructed to link this failure effect to a plurality of possible causes.

A number of possible causes may be identified by virtue of the relationships in the network structure. For example, one possible cause may be related to the pressure in the chamber, while another possible cause may be related to a pedestal temperature. Other possible causes may include $H_2O$ deposition, applied power, a location of the wafer on the pedestal, among others. A sensitivity analysis may be carried out where the inputs (e.g., pressure and pedestal temperature) are varied in order to determine the sensitivity of the output effect (e.g., wafer temperature) when this analysis is performed, the pressure may be observed to be responsible for 43% of the change of the wafer temperature, and the pedestal temperature may be responsible for 42% of the change of the wafer temperature. In other words, the likelihood of the wafer temperature failing given that the pressure has failed is approximately 43%. Other possible causes may have a contribution of less than 10% to the change of the wafer temperature. Thus, this analysis can focus on the pedestal temperature and chamber pressure as possible causes.

Instead of relying solely on the probability produced by the sensitivity analysis, Bayes' Rule can also consider the probabilities of the pedestal temperature and the pressure failing in the first place. For example, domain knowledge based on previous experimentation, simulation results, and/or measured data may reveal that the probability of the pressure falling outside of a specified range is approximately 3%. In comparison, the domain knowledge may indicate that the probability of the pedestal temperature falling outside of the desired range is approximately 10%. These percentages may be taken from known failure rates of components used to construct the chamber. Using the formulation of Bayes' Rule illustrated in FIG. 5, it may be determined that the probability of the pressure being the final cause of the wafer temperature failure is only 15.9% compared to the probability of the pedestal temperature being the final cause, which may be approximately 51.9%.

This illustrates how Bayes' Rule can be used to solve ill-posed inverse problems where no unique solution exists. In the example of FIG. 5, the result does not indicate a single specific cause, but rather computes probabilities for one of a number of different possible causes. Because Bayes' Rule generates a probability output based on both a probability under consideration and a prior probability, these relationships can be used to form a network of conditional probabilities referred to as a Bayesian network. The network structure 300 in FIG. 3 may be assigned conditional probabilities at each node using Bayes' Rule.

For example, the process may assign a probability to node 306-2 representing a deposition rate at a center of the wafer. That probability may depend on the probabilities of each of its parent nodes 304-4, 304-5, 304-6, and 304-10. Note that each of these parent nodes represents a function at R=0 mm. Thus, the deposition rates may be calculated for each combination of the values for the input nodes. However, as described above, the probabilities for the parent nodes have been previously conditioned such that they may be subdivided into a small number (e.g., five buckets) of representative values over defined ranges. The possible probabilities may be assigned by calculating probabilities that each combination of possible input values, which even using the discrete value ranges described above may result in a very large data set of probabilities at each of the possible input values. For these discrete ranges, the individual probabilities may be aggregated together. Alternatively, if continuous ranges of probabilities are used, the values can be integrated together over a continuous range of values.

Figure 6:
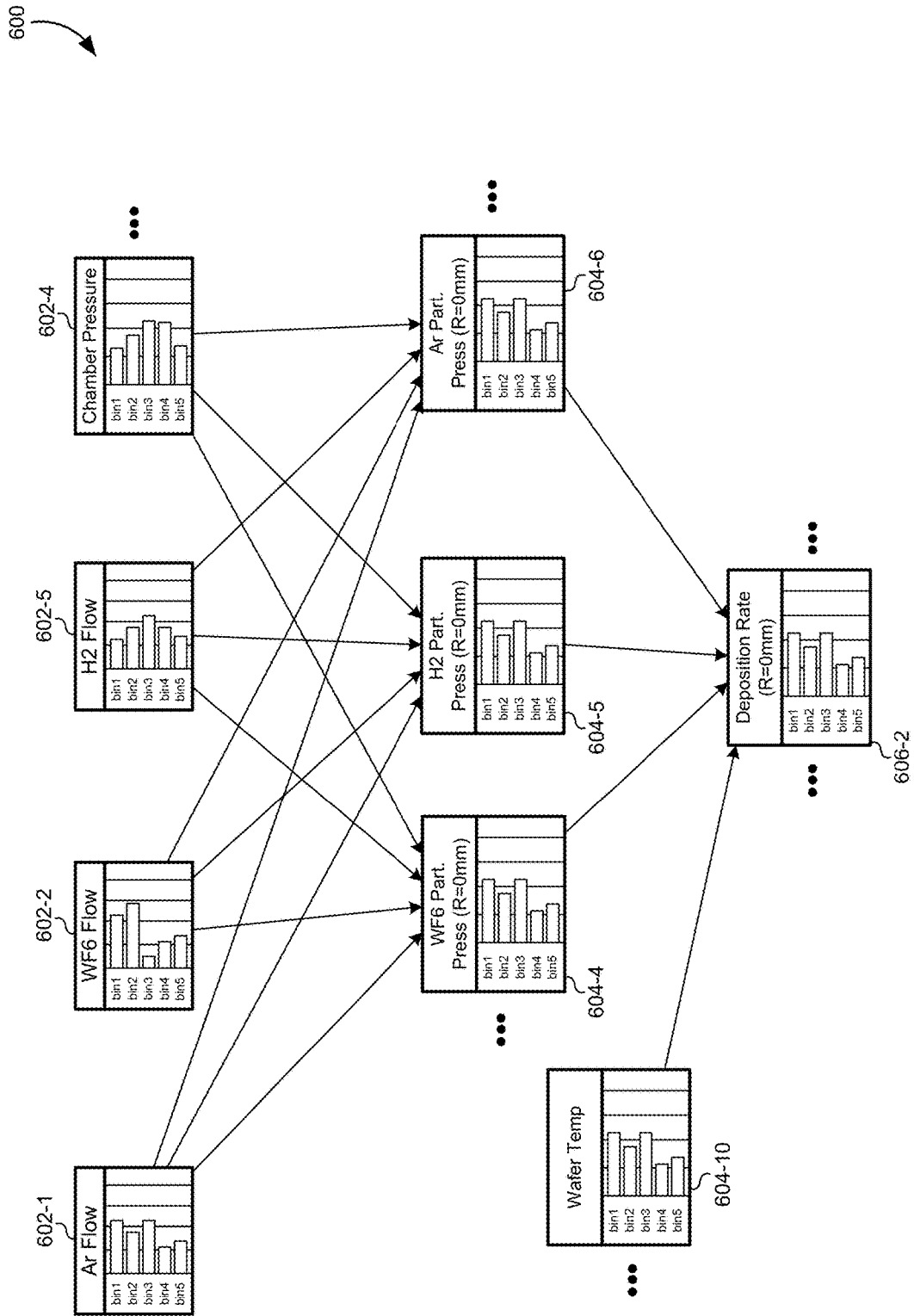
FIG. 6 illustrates a resulting set of probability values that are assigned to each of the nodes in the network structure, according to some embodiments.

Although single probability values were used in FIG. 5 as an example, most input probabilities will be represented by a probability distribution rather than a singular value. FIG. 6 illustrates a resulting set of probability values that are assigned to each of the nodes in the network structure, according to some embodiments. For each node, the process described above may be carried out by generating possible probabilities from each of the parent nodes and aggregating/integrating those values together to generate a final probability distribution for the child node based on Bayes' Rule. The probability distribution of each node may represent the probability of failure based on the chain of probabilities from each of the preceding nodes in the hierarchy.

Turning back to FIG. 1, the method may also include processing a failure query with the network and updating the node probabilities (128). Once the probabilities of the network structure nodes have been set, the network structure may be available to accept queries using subsequent failure data. For example, a network query may be generated to determine root cause of a deposition rate being outside of the operating range (e.g., the query="what if the deposition rate is more than 7.5 at R=0 mm?"). The query may be entered as a result of an event obtained from sensor data, on-wafer data, or component data depending on the nature of the problem. For example, a sensor may record an electrical short circuit or a deposition rate falling outside of a predetermined range. In order to find the cause of this failure, the query for the network structure can set the failure mode for the deposition rate node 606-2 and update the probabilities of the parent nodes throughout the network until the probabilities are updated for the causal nodes 602. Thus, the query may result in calculating the change in the probabilities assigned to the nodes representing the component functions.

Figure 7:
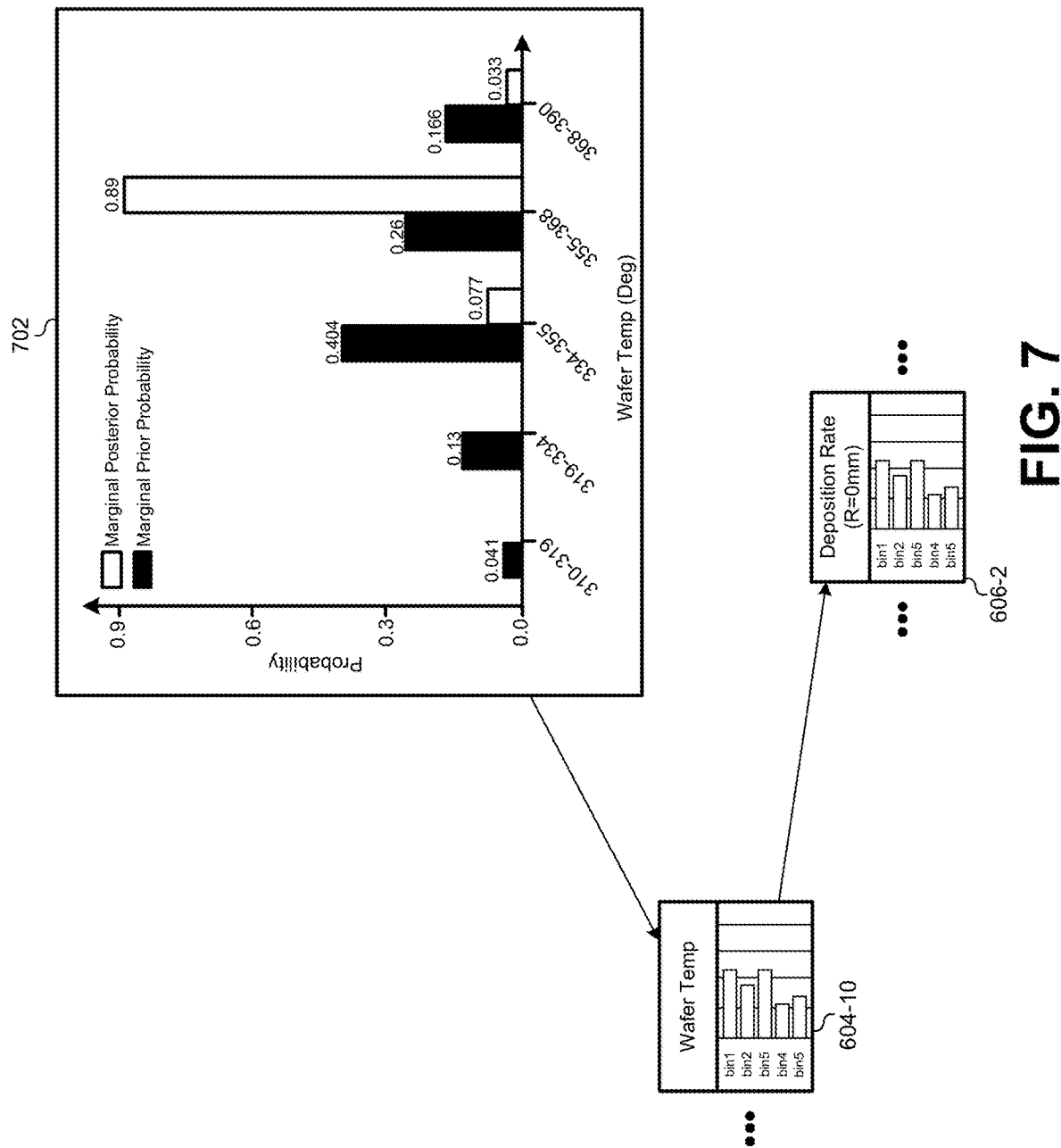
FIG. 7 illustrates a graph showing how a parent node representing the wafer temperature may generate two probabilities based on the failure data, according to some embodiments.

Similar to the sensitivity analysis described above, two different probabilities may be calculated for each of the possible cause nodes for the deposition rate (R=0 mm) node 606-2. FIG. 7 illustrates a graph showing how a parent node 604-10 representing the wafer temperature may generate two probabilities based on the failure data, according to some embodiments. First, the "prior" probability distribution represents the probabilities of the network before the failure data is taken into account. Second, a "posterior" probability distribution may be calculated using the failure data. Graph 702 illustrates a comparison of the prior probability distribution and the posterior probability distribution when the failure data is taken into account. Note that the probability distribution of the node 604-10 may change significantly with the failure data submitted with the query.

Turning back to FIG. 1, the method may also include calculating a largest variable probability change (130). This step may be used to identify the parent nodes that have the largest change between the prior and posterior probability distributions when the failure condition is taken into account. Generally, the larger the change between these distributions, the more likely the function represented by the node is related to a root cause of the failure.

Figures 8A, 8B:
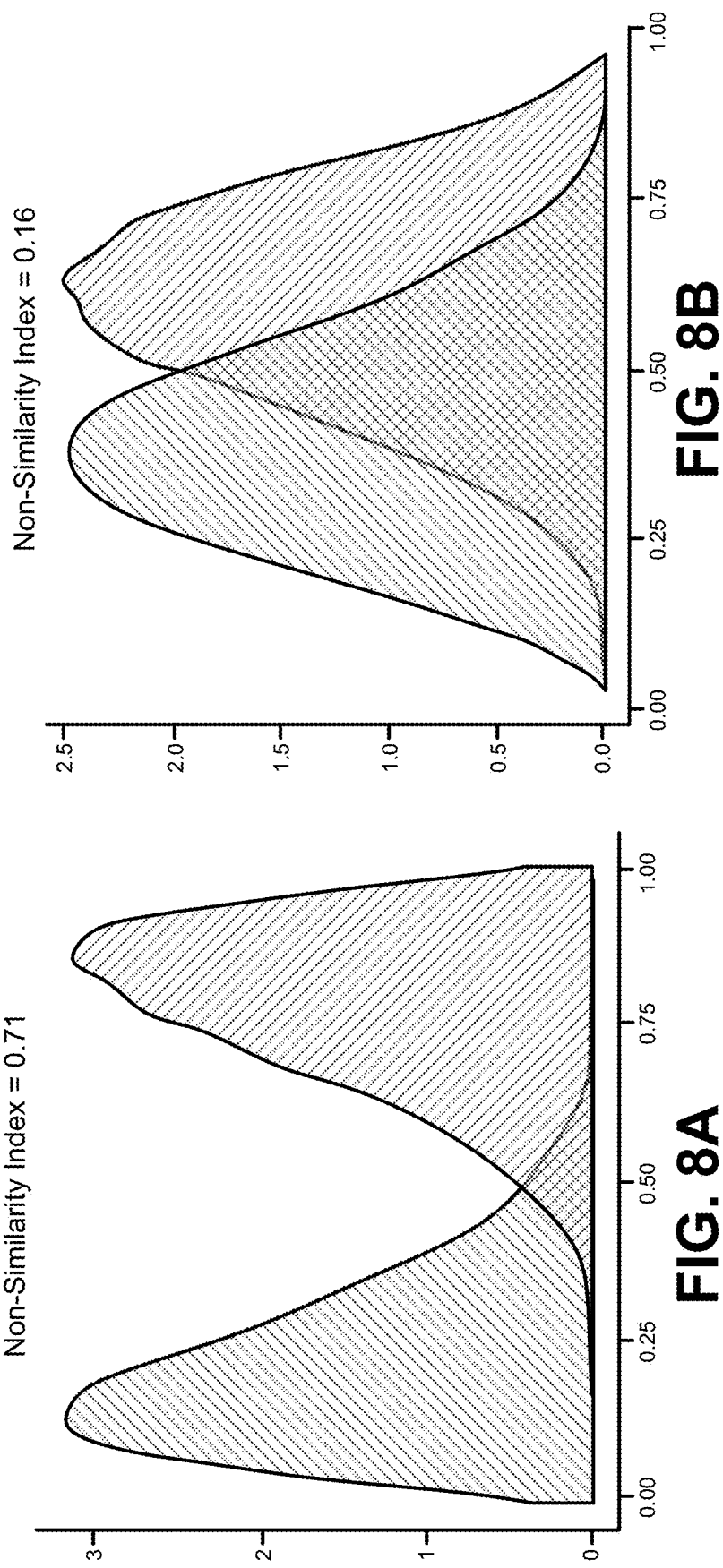
FIGS. 8A-8B illustrate how a similarity measure may be used to identify probability distributions that show the greatest change between the prior and posterior distributions, according to some embodiments.

FIGS. 8A-8B illustrate how a similarity measure may be used to identify probability distributions that show the greatest change between the prior and posterior distributions, according to some embodiments. In order to measure a magnitude of the change between the prior and posterior distributions, a similarity measure may be used to compare these distributions. For example, FIG. 8A illustrates two distributions that are relatively different from each other, representing a relatively large change between the prior and posterior distributions. In contrast, FIG. 8B illustrates two distributions that are relatively similar to each other, representing a relatively small change between the prior and posterior distributions. Although any similarity measure may be used, some embodiments may use a Jensen-Shannon (JS) Divergence method for measuring the similarity between two probability distributions.

Figure 9:
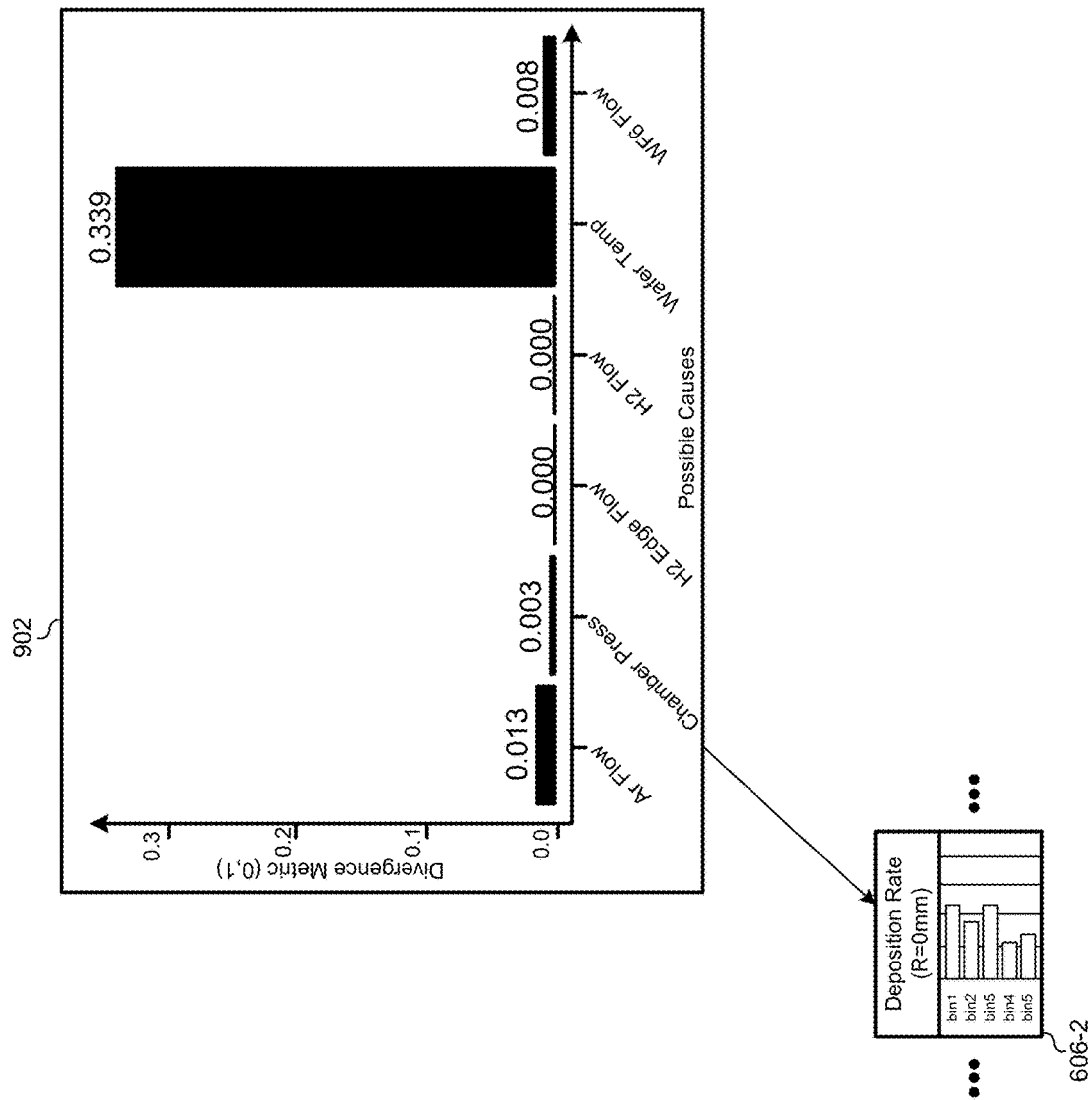
FIG. 9 illustrates the result of the similarity measure for each of the causal nodes that can be traced through relationships to the deposition rate node, according to some embodiments.

Turning back to FIG. 1, the method may further include outputting probable causes of the failure from the similarity comparison of the distributions generated by the network structure (132). FIG. 9 illustrates the result of the similarity measure (e.g., the JS Divergence Metric) on a scale of 0.0 to 1.0 for each of the causal nodes 302 that can be traced through relationships to the deposition rate node 606-2. In this example, the wafer temperature exhibited the most significant change as measured by the similarity measure in comparison to the other causal nodes 302. Thus, the output may provide the calculated divergence metric from the similarity measure assigned to each of the causal nodes 302. The divergence metric can be used to generate an output indicating a probability of at least one of the component functions as a cause of the failure in the semiconductor processing system. Some embodiments may generate a ranked listing of probabilities for each of the component functions.

This output may be used as a starting point for mitigating the failure. Since the metrics assigned to the causes are based on probabilities, this output does not represent a definite indication of a cause of the failure, but rather indicates the most likely causes for which mitigation techniques may be applied. The network structure may be used not only to identify a probable cause for the failure, but the network structure may also be used to evaluate possible mitigation techniques to address the failure. The divergence metric may be used to output the most likely component function to be the cause of the failure (e.g., at least one of the component functions may be output). Some embodiments may also generate a ranked list of a plurality of component functions, where the ranking may be determined based on the divergence metric.

Continuing with the example above where wafer temperature is the most likely cause of the deposition rate failure, possible mitigation techniques may attempt to better control the wafer temperature to prevent the deposition rate failure from happening on subsequent processes. These mitigation steps may include reducing the operating range or specification for the heater control (e.g., shifting from ±6° C. to ±3° C.) and other specific inputs that may be provided to the network structure. These mitigation steps may be implemented in the semiconductor process, and a new data set may be obtained based on these mitigation steps. The new data set may be collected by simulation or through sensor measurements a physical process being executed. This new data set may then be provided to the network using the same techniques described above and a query may be generated (e.g., what if the deposition rate is more than 7.25?). The resulting probability of the wafer temperature being the root cause of a deposition failure can then be compared to the previous probability of the wafer temperature being the root cause as calculated in FIG. 9. If the probability of capturing the root cause has been reduced, then it may be assumed that the mitigation technique is effective.

If the temperature wafer being the root cause has been sufficiently addressed, this may result in the probabilities of other inputs being the root cause of a deposition failure being increased relatively. Thus, this mitigation and re-querying cycle may be iterated a number of times until the probabilities of each cause have been reduced below predetermined thresholds. Note that the network structure described above can operate bidirectionally to perform inferences for both causes and failures. For example, the network can operate predictively where input causes can be used to predict the probability of a failure. Additionally, the network can also set a failure mode as described above and see the probabilities assigned to possible causes. Additionally, the examples above have been simplified to use only single failures. However, the network structure can be used to assign multiple failures and see the joint contribution of any number of possible causes. For example, failures may be set for a deposition rate of more than 7.0 for R=0 mm and for a deposition rate of less than 6.5 for R=147 mm, while eliminating the WF6 flow control as a possible cause. The causal probabilities of the remaining causal nodes may then be calculated to determine the likelihood of causing this type of joint failure.

It should be appreciated that the specific steps illustrated in FIG. 1 provide particular methods of identifying failure causes in a semiconductor processing system according to various embodiments. Other sequences of steps may also be performed according to alternative embodiments. For example, alternative embodiments may perform the steps outlined above in a different order. Moreover, the individual steps illustrated in FIG. 1 may include multiple sub-steps that may be performed in various sequences as appropriate to the individual step. Furthermore, additional steps may be added or removed depending on the particular applications. Many variations, modifications, and alternatives also fall within the scope of this disclosure.

Each of the methods described herein may be implemented by a computer system. Each step of these methods may be executed automatically by the computer system, and/or may be provided with inputs/outputs involving a user. For example, a user may provide inputs for each step in a method, and each of these inputs may be in response to a specific output requesting such an input, wherein the output is generated by the computer system. Each input may be received in response to a corresponding requesting output. Furthermore, inputs may be received from a user, from another computer system as a data stream, retrieved from a memory location, retrieved over a network, requested from a web service, and/or the like. Likewise, outputs may be provided to a user, to another computer system as a data stream, saved in a memory location, sent over a network, provided to a web service, and/or the like. In short, each step of the methods described herein may be performed by a computer system, and may involve any number of inputs, outputs, and/or requests to and from the computer system which may or may not involve a user. Those steps not involving a user may be said to be performed automatically by the computer system without human intervention. Therefore, it will be understood in light of this disclosure, that each step of each method described herein may be altered to include an input and output to and from a user, or may be done automatically by a computer system without human intervention where any determinations are made by a processor. Furthermore, some embodiments of each of the methods described herein may be implemented as a set of instructions stored on a tangible, non-transitory storage medium to form a tangible software product.

Figure 10:
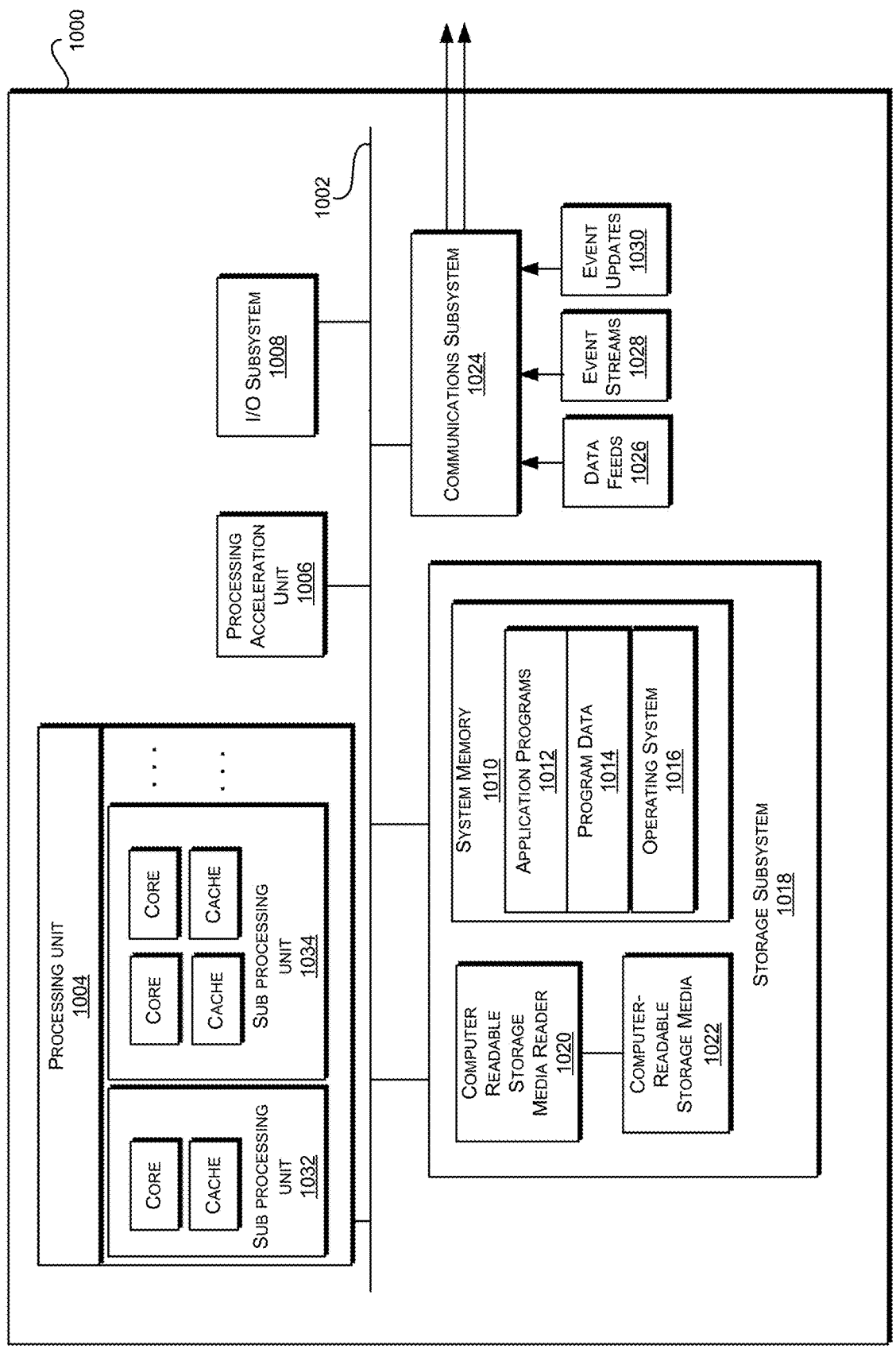
FIG. 10 illustrates an exemplary computer system, in which various embodiments may be implemented.

FIG. 10 illustrates an exemplary computer system 1000, in which various embodiments may be implemented. The system 1000 may be used to implement any of the computer systems described above. As shown in the figure, computer system 1000 includes a processing unit 1004 that communicates with a number of peripheral subsystems via a bus subsystem 1002. These peripheral subsystems may include a processing acceleration unit 1006, an I/O subsystem 1008, a storage subsystem 1018 and a communications subsystem 1024. Storage subsystem 1018 includes tangible computer-readable storage media 1022 and a system memory 1010.

Bus subsystem 1002 provides a mechanism for letting the various components and subsystems of computer system 1000 communicate with each other as intended. Although bus subsystem 1002 is shown schematically as a single bus, alternative embodiments of the bus subsystem may utilize multiple buses. Bus subsystem 1002 may be any of several types of bus structures including a memory bus or memory controller, a peripheral bus, and a local bus using any of a variety of bus architectures. For example, such architectures may include an Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus, which can be implemented as a Mezzanine bus manufactured to the IEEE P1386.1 standard.

Processing unit 1004, which can be implemented as one or more integrated circuits (e.g., a conventional microprocessor or microcontroller), controls the operation of computer system 1000. One or more processors may be included in processing unit 1004. These processors may include single core or multicore processors. In certain embodiments, processing unit 1004 may be implemented as one or more independent processing units 1032 and/or 1034 with single or multicore processors included in each processing unit. In other embodiments, processing unit 1004 may also be implemented as a quad-core processing unit formed by integrating two dual-core processors into a single chip.

In various embodiments, processing unit 1004 can execute a variety of programs in response to program code and can maintain multiple concurrently executing programs or processes. At any given time, some or all of the program code to be executed can be resident in processor(s) 1004 and/or in storage subsystem 1018. Through suitable programming, processor(s) 1004 can provide various functionalities described above. Computer system 1000 may additionally include a processing acceleration unit 1006, which can include a digital signal processor (DSP), a special-purpose processor, and/or the like.

I/O subsystem 1008 may include user interface input devices and user interface output devices. User interface input devices may include a keyboard, pointing devices such as a mouse or trackball, a touchpad or touch screen incorporated into a display, a scroll wheel, a click wheel, a dial, a button, a switch, a keypad, audio input devices with voice command recognition systems, microphones, and other types of input devices. User interface input devices may include, for example, motion sensing and/or gesture recognition devices such as the Microsoft Kinect® motion sensor that enables users to control and interact with an input device, such as the Microsoft Xbox® 360 game controller, through a natural user interface using gestures and spoken commands. User interface input devices may also include eye gesture recognition devices such as the Google Glass® blink detector that detects eye activity (e.g., 'blinking' while taking pictures and/or making a menu selection) from users and transforms the eye gestures as input into an input device (e.g., Google Glass®). Additionally, user interface input devices may include voice recognition sensing devices that enable users to interact with voice recognition systems (e.g., Siri® navigator), through voice commands.

User interface input devices may also include, without limitation, three dimensional (3D) mice, joysticks or pointing sticks, gamepads and graphic tablets, and audio/visual devices such as speakers, digital cameras, digital camcorders, portable media players, webcams, image scanners, fingerprint scanners, barcode reader 3D scanners, 3D printers, laser rangefinders, and eye gaze tracking devices. Additionally, user interface input devices may include, for example, medical imaging input devices such as computed tomography, magnetic resonance imaging, position emission tomography, medical ultrasonography devices. User interface input devices may also include, for example, audio input devices such as MIDI keyboards, digital musical instruments and the like.

User interface output devices may include a display subsystem, indicator lights, or non-visual displays such as audio output devices, etc. The display subsystem may be a cathode ray tube (CRT), a flat-panel device, such as that using a liquid crystal display (LCD) or plasma display, a projection device, a touch screen, and the like. In general, use of the term "output device" is intended to include all possible types of devices and mechanisms for outputting information from computer system 1000 to a user or other computer. For example, user interface output devices may include, without limitation, a variety of display devices that visually convey text, graphics and audio/video information such as monitors, printers, speakers, headphones, automotive navigation systems, plotters, voice output devices, and modems.

Computer system 1000 may comprise a storage subsystem 1018 that comprises software elements, shown as being currently located within a system memory 1010. System memory 1010 may store program instructions that are loadable and executable on processing unit 1004, as well as data generated during the execution of these programs.

Depending on the configuration and type of computer system 1000, system memory 1010 may be volatile (such as random access memory (RAM)) and/or non-volatile (such as read-only memory (ROM), flash memory, etc.) The RAM typically contains data and/or program modules that are immediately accessible to and/or presently being operated and executed by processing unit 1004. In some implementations, system memory 1010 may include multiple different types of memory, such as static random access memory (SRAM) or dynamic random access memory (DRAM). In some implementations, a basic input/output system (BIOS), containing the basic routines that help to transfer information between elements within computer system 1000, such as during start-up, may typically be stored in the ROM. By way of example, and not limitation, system memory 1010 also illustrates application programs 1012, which may include client applications, Web browsers, mid-tier applications, relational database management systems (RDBMS), etc., program data 1014, and an operating system 1016. By way of example, operating system 1016 may include various versions of Microsoft Windows®, Apple Macintosh®, and/or Linux operating systems, a variety of commercially-available UNIX® or UNIX-like operating systems (including without limitation the variety of GNU/Linux operating systems, the Google Chrome® OS, and the like) and/or mobile operating systems such as iOS, Windows® Phone, Android® OS, BlackBerry® 10 OS, and Palm® OS operating systems.

Storage subsystem 1018 may also provide a tangible computer-readable storage medium for storing the basic programming and data constructs that provide the functionality of some embodiments. Software (programs, code modules, instructions) that when executed by a processor provide the functionality described above may be stored in storage subsystem 1018. These software modules or instructions may be executed by processing unit 1004. Storage subsystem 1018 may also provide a repository for storing data used in accordance with some embodiments.

Storage subsystem 1000 may also include a computer-readable storage media reader 1020 that can further be connected to computer-readable storage media 1022. Together and, optionally, in combination with system memory 1010, computer-readable storage media 1022 may comprehensively represent remote, local, fixed, and/or removable storage devices plus storage media for temporarily and/or more permanently containing, storing, transmitting, and retrieving computer-readable information.

Computer-readable storage media 1022 containing code, or portions of code, can also include any appropriate media, including storage media and communication media, such as but not limited to, volatile and non-volatile, removable and non-removable media implemented in any method or technology for storage and/or transmission of information. This can include tangible computer-readable storage media such as RAM, ROM, electronically erasable programmable ROM (EEPROM), flash memory or other memory technology, CD-ROM, digital versatile disk (DVD), or other optical storage, magnetic cassettes, magnetic tape, magnetic disk storage or other magnetic storage devices, or other tangible computer readable media. This can also include nontangible computer-readable media, such as data signals, data transmissions, or any other medium which can be used to transmit the desired information and which can be accessed by computing system 1000.

By way of example, computer-readable storage media 1022 may include a hard disk drive that reads from or writes to non-removable, nonvolatile magnetic media, a magnetic disk drive that reads from or writes to a removable, non-volatile magnetic disk, and an optical disk drive that reads from or writes to a removable, nonvolatile optical disk such as a CD ROM, DVD, and Blu-Ray® disk, or other optical media. Computer-readable storage media 1022 may include, but is not limited to, Zip® drives, flash memory cards, universal serial bus (USB) flash drives, secure digital (SD) cards, DVD disks, digital video tape, and the like. Computer-readable storage media 1022 may also include, solid-state drives (SSD) based on non-volatile memory such as flash-memory based SSDs, enterprise flash drives, solid state ROM, and the like, SSDs based on volatile memory such as solid state RAM, dynamic RAM, static RAM, DRAM-based SSDs, magnetoresistive RAM (MRAM) SSDs, and hybrid SSDs that use a combination of DRAM and flash memory based SSDs. The disk drives and their associated computer-readable media may provide non-volatile storage of computer-readable instructions, data structures, program modules, and other data for computer system 1000.

Communications subsystem 1024 provides an interface to other computer systems and networks. Communications subsystem 1024 serves as an interface for receiving data from and transmitting data to other systems from computer system 1000. For example, communications subsystem 1024 may enable computer system 1000 to connect to one or more devices via the Internet. In some embodiments communications subsystem 1024 can include radio frequency (RF) transceiver components for accessing wireless voice and/or data networks (e.g., using cellular telephone technology, advanced data network technology, such as 3G, 4G or EDGE (enhanced data rates for global evolution), WiFi (IEEE 802.11 family standards, or other mobile communication technologies, or any combination thereof), global positioning system (GPS) receiver components, and/or other components. In some embodiments communications subsystem 1024 can provide wired network connectivity (e.g., Ethernet) in addition to or instead of a wireless interface.

In some embodiments, communications subsystem 1024 may also receive input communication in the form of structured and/or unstructured data feeds 1026, event streams 1028, event updates 1030, and the like on behalf of one or more users who may use computer system 1000.

By way of example, communications subsystem 1024 may be configured to receive data feeds 1026 in real-time from users of social networks and/or other communication services such as Twitter® feeds, Facebook® updates, web feeds such as Rich Site Summary (RSS) feeds, and/or real-time updates from one or more third party information sources.

Additionally, communications subsystem 1024 may also be configured to receive data in the form of continuous data streams, which may include event streams 1028 of real-time events and/or event updates 1030, that may be continuous or unbounded in nature with no explicit end. Examples of applications that generate continuous data may include, for example, sensor data applications, financial tickers, network performance measuring tools (e.g. network monitoring and traffic management applications), clickstream analysis tools, automobile traffic monitoring, and the like.

Communications subsystem 1024 may also be configured to output the structured and/or unstructured data feeds 1026, event streams 1028, event updates 1030, and the like to one or more databases that may be in communication with one or more streaming data source computers coupled to computer system 1000.

Computer system 1000 can be one of various types, including a handheld portable device (e.g., an iPhone® cellular phone, an iPad® computing tablet, a PDA), a wearable device (e.g., a Google Glass® head mounted display), a PC, a workstation, a mainframe, a kiosk, a server rack, or any other data processing system.

Due to the ever-changing nature of computers and networks, the description of computer system 1000 depicted in the figure is intended only as a specific example. Many other configurations having more or fewer components than the system depicted in the figure are possible. For example, customized hardware might also be used and/or particular elements might be implemented in hardware, firmware, software (including applets), or a combination. Further, connection to other computing devices, such as network input/output devices, may be employed. Based on the disclosure and teachings provided herein, other ways and/or methods to implement the various embodiments should be apparent.

In the foregoing description, for the purposes of explanation, numerous specific details were set forth in order to provide a thorough understanding of various embodiments. It will be apparent, however, that some embodiments may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of various embodiments will provide an enabling disclosure for implementing at least one embodiment. It should be understood that various changes may be made in the function and arrangement of elements without departing from the spirit and scope of some embodiments as set forth in the appended claims.

Specific details are given in the foregoing description to provide a thorough understanding of the embodiments. However, it will be understood that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have beeen described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "computer-readable medium" includes, but is not limited to portable or fixed storage devices, optical storage devices, wireless channels and various other mediums capable of storing, containing, or carrying instruction(s) and/or data. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc., may be passed, forwarded, or transmitted via any suitable means including memory sharing, message passing, token passing, network transmission, etc.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

In the foregoing specification, features are described with reference to specific embodiments thereof, but it should be recognized that not all embodiments are limited thereto. Various features and aspects of some embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

Additionally, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor or logic circuits programmed with the instructions to perform the methods. These machine-executable instructions may be stored on one or more machine readable mediums, such as CD-ROMs or other type of optical disks, floppy diskettes, ROMs, RAMs, EPROMs, EEPROMs, magnetic or optical cards, flash memory, or other types of machine-readable mediums suitable for storing electronic instructions. Alternatively, the methods may be performed by a combination of hardware and software.

What is claimed is:

1. A method of detecting failure causes in semiconductor processing systems, the method comprising:
   receiving an indication of a failure in a semiconductor processing system;
   providing the indication of the failure as a query to a network representing the semiconductor processing system, wherein the network comprises:
      a plurality of nodes representing on-wafer effects and component functions;
      a plurality of relationships between the plurality of nodes, wherein the plurality of relationships represent causal dependencies between the component functions and the on-wafer effects;
   calculating a change in probabilities assigned to nodes representing the component functions in the plurality of nodes resulting from the query; and
   generating, based on the change in probabilities, an output indicating a probability of at least one of the component functions as a cause of the failure in the semiconductor processing system.

2. The method of claim 1, wherein the network comprises a Bayesian network.

3. The method of claim 1, wherein the component functions comprise a gas flow rate, a chamber pressure, and a wafer temperature.

4. The method of claim 1, wherein the on-wafer effects comprise a deposition rate at a plurality of locations on a wafer.

5. The method of claim 1, wherein the probabilities assigned to the nodes representing the component functions comprise probability distributions that are discretized into buckets of numerical ranges.

6. The method of claim 1, wherein the query comprises an event corresponding to a node representing an on-wafer effect, wherein the event indicates that the on-wafer effect is outside of a predetermined range.

7. The method of claim 1, wherein the semiconductor processing system comprises a system for depositing a film on a semiconductor wafer.

8. A non-transitory computer-readable medium comprising instructions that, when executed by one or more processors, cause the one or more processors to perform operations comprising:
   receiving an indication of a failure in a semiconductor processing system;
   providing the indication of the failure as a query to a network representing the semiconductor processing system, wherein the network comprises:
      a plurality of nodes representing on-wafer effects and component functions;
      a plurality of relationships between the plurality of nodes, wherein the plurality of relationships represent causal dependencies between the component functions and the on-wafer effects;
   calculating a change in probabilities assigned to nodes representing the component functions in the plurality of nodes resulting from the query; and
   generating, based on the change in probabilities, an output indicating a probability of at least one of the component functions as a cause of the failure in the semiconductor processing system.

9. The non-transitory computer-readable medium of claim 8, wherein the operations further comprise:
   accessing a system functional map comprising a data structure that relates requirements for the semiconductor processing system, to functional requirements for components in the semiconductor processing system, to technology components, to on-wafer effects; and
   automatically generating the network from the functional map.

10. The non-transitory computer-readable medium of claim 8, wherein the operations further comprise:
    receiving operational data for the semiconductor processing system; and
    calculating initial probabilities for the plurality of nodes in the network based on the operational data for the semiconductor processing system.

11. The non-transitory computer-readable medium of claim 10, wherein the operational data is generated by a simulation of the semiconductor processing system.

12. The non-transitory computer-readable medium of claim 10, wherein the operational data represents sensor measurements from operation of the semiconductor processing system when a failure occurred.

13. The non-transitory computer-readable medium of claim 10, wherein:
    the operational data includes values in a numerical range; and
    the operations further comprise discretizing the operational data into a plurality of buckets representing sub-ranges within the numerical range.

14. The non-transitory computer-readable medium of claim 10, wherein the operations further comprise:
    using the operational data to statistically verify that the plurality of relationships between the plurality of nodes in the network are correct.

15. A system comprising:
    one or more processors; and
    one or more memory devices comprising instructions that, when executed by the one or more processors, cause the one or more processors to perform operations comprising:
       receiving an indication of a failure in a semiconductor processing system;
       providing the indication of the failure as a query to a network representing the semiconductor processing system, wherein the network comprises:
          a plurality of nodes representing on-wafer effects and component functions;
          a plurality of relationships between the plurality of nodes, wherein the plurality of relationships represent causal dependencies between the component functions and the on-wafer effects;
       calculating a change in probabilities assigned to nodes representing the component functions in the plurality of nodes resulting from the query; and
       generating, based on the change in probabilities, an output indicating a probability of at least one of the component functions as a cause of the failure in the semiconductor processing system.

16. The system of claim 15, wherein generating the output indicating the probability of the at least one of the component functions as the cause of the failure in the semiconductor processing system comprises:
    comparing a prior probability distribution to a posterior probability distribution for a node representing the at least one of the component functions; and generating a divergence metric for the at least one of the component functions.

17. The system of claim 16, wherein the output indicating the probability of the at least one of the component functions as the cause of the failure comprises generating a list of potential causes of the failure ranked by the divergence metric for the at least one of the component functions.

18. The system of claim 15, wherein nodes representing on-wafer effects include a subset of nodes representing one on-wafer effect, wherein each of the subset of nodes represents the one on-wafer effect at a different location on a wafer.

19. The system of claim 15, wherein the system further comprises a chemical vapor deposition chamber.

20. The system of claim 15, wherein the operations further comprise:
   receiving a change to operational data as a mitigation of the failure in the semiconductor processing system;
   using the operational data with the change to update the probabilities assigned to nodes representing the component functions;
   updating probabilities assigned to the nodes representing the on-wafer effects; and
   determining whether the change to the operational data reduced the probability of the at least one of the component functions as the cause of the failure in the semiconductor processing system based at least in part on the probabilities assigned to the nodes representing the on-wafer effects.

* * * * *